(12) United States Patent
Seki et al.

(10) Patent No.: US 9,194,559 B2
(45) Date of Patent: Nov. 24, 2015

(54) ILLUMINATION LENS AND ILLUMINATION MODULE

(71) Applicant: NALUX CO., LTD., Osaka-shi, Osaka (JP)

(72) Inventors: Daisuke Seki, Osaka (JP); Katsumoto Ikeda, Osaka (JP); Takatoshi Suzuki, Osaka (JP)

(73) Assignee: NALUX CO., LTD., Osaka (JP)

( * ) Notice: Subject to any disclaimer, the term of this patent is extended or adjusted under 35 U.S.C. 154(b) by 57 days.

(21) Appl. No.: 14/035,192

(22) Filed: Sep. 24, 2013

(65) Prior Publication Data

US 2014/0063801 A1    Mar. 6, 2014

Related U.S. Application Data

(63) Continuation of application No. PCT/JP2012/056374, filed on Mar. 13, 2012.

(60) Provisional application No. 61/467,557, filed on Mar. 25, 2011.

(51) Int. Cl.

| | |
|---|---|
| *F21V 13/04* | (2006.01) |
| *F21V 5/04* | (2006.01) |
| *G02B 3/02* | (2006.01) |
| *G02B 19/00* | (2006.01) |
| *G02B 3/04* | (2006.01) |
| *G02F 1/1335* | (2006.01) |
| *F21V 13/02* | (2006.01) |
| *G02B 3/00* | (2006.01) |
| *H01L 33/58* | (2010.01) |

(52) U.S. Cl.
CPC . *F21V 13/04* (2013.01); *F21V 5/04* (2013.01); *F21V 13/02* (2013.01); *G02B 3/04* (2013.01); *G02B 19/0014* (2013.01); *G02B 19/0066* (2013.01); *G02F 1/133603* (2013.01); *G02B 2003/0093* (2013.01); *G02F 2001/133607* (2013.01); *H01L 33/58* (2013.01)

(58) Field of Classification Search
CPC ........... F21V 5/007; F21V 5/04; F21V 5/046; F21V 5/048; F21V 13/04; G02B 3/00; G02B 3/02; G02B 3/08; G02B 2003/0093; G02B 13/18; G02B 19/0061; G02B 19/0066; G02B 19/0071; G02F 1/33607; G02F 1/133611
USPC ......... 362/237, 240, 244–24, 311.01, 311.02, 362/311.06, 311.08, 311.09, 311.1, 326, 362/327, 331
See application file for complete search history.

(56) References Cited

U.S. PATENT DOCUMENTS

| | | |
|---|---|---|
| 6,894,764 B2 | 5/2005 | Shinoda |
| 7,052,152 B2 | 5/2006 | Harbers et al. |
| 7,142,769 B2 | 11/2006 | Hsieh et al. |
| 7,649,593 B2 | 1/2010 | Yoon et al. |
| 2003/0197847 A1 | 10/2003 | Shinoda |
| 2005/0073495 A1 | 4/2005 | Harbers et al. |
| 2006/0067640 A1 | 3/2006 | Hsieh et al. |
| 2006/0209563 A1* | 9/2006 | Hirota et al. ................... 362/608 |
| 2006/0244879 A1 | 11/2006 | Yoon et al. |
| 2008/0007966 A1 | 1/2008 | Ohkawa |
| 2009/0207586 A1* | 8/2009 | Arai et al. ..................... 362/97.1 |

FOREIGN PATENT DOCUMENTS

| | | |
|---|---|---|
| EP | 1 521 235 A2 | 4/2005 |
| EP | 1 717 633 A1 | 11/2006 |
| JP | 2003-318086 A | 11/2003 |
| JP | 2005-115372 A | 4/2005 |
| JP | 2006-99117 A | 4/2006 |
| JP | 4332539 B2 | 6/2009 |
| JP | 2010-212083 A | 9/2010 |
| JP | 4842107 B2 | 10/2011 |
| JP | 4863357 B2 | 11/2011 |

OTHER PUBLICATIONS

Machine Translation of JP 2010-212083 A, retrieved Jan. 10, 2015.*
International Search Report mailed Jun. 19, 2012 issued in corresponding International Application No. PCT/JP2012/056374.

* cited by examiner

Primary Examiner — Elmito Breval
Assistant Examiner — Steven Horikoshi
(74) *Attorney, Agent, or Firm* — Squire Patton Boggs (US) LLP

(57) ABSTRACT

An illumination lens includes a light receiving surface 101; and a light exit surface 103. When the axis of 101 is designated as Z-axis, a position of the bottom of the lens is designated as z=0 and X-axis and Y-axis are defined in a plane which contains z=0 and is perpendicular to Z-axis, 101 is symmetric about YZ-plane and XZ-plane and a cross-sectional area of a cross section of 101 parallel to XY-plane monotonously decreases with increase in z-coordinate. When the maximum value of z-coordinate on 101 is designated as d and a radius of the cross section of 103 at z=0 is designated as r, a point (x, y) on a cross section of 101 at z=0.3*d* is represented by $$\sqrt{\left(\frac{x}{a}\right)^2 + \left(\frac{y}{b}\right)^2} = f(\theta) \quad (1)$$

$$0 \leq \theta \leq \frac{\pi}{2}$$

where a and b represent constants and $$\theta = \tan^{-1}\left(\frac{y}{x}\right) \quad (2)$$

$$f(0) = f\left(\frac{\pi}{2}\right) = 1.0,$$

and $$f(\theta) \leq 1.0$$

$$1 \leq \frac{x}{a} + \frac{y}{b} \quad (3)$$

and there exists a point at which $f(\theta) \leq 0.95$ and $a < 0.5r$ and $b < 0.5r$.

5 Claims, 12 Drawing Sheets

(a)

(b)

(a)

(b)

(c)

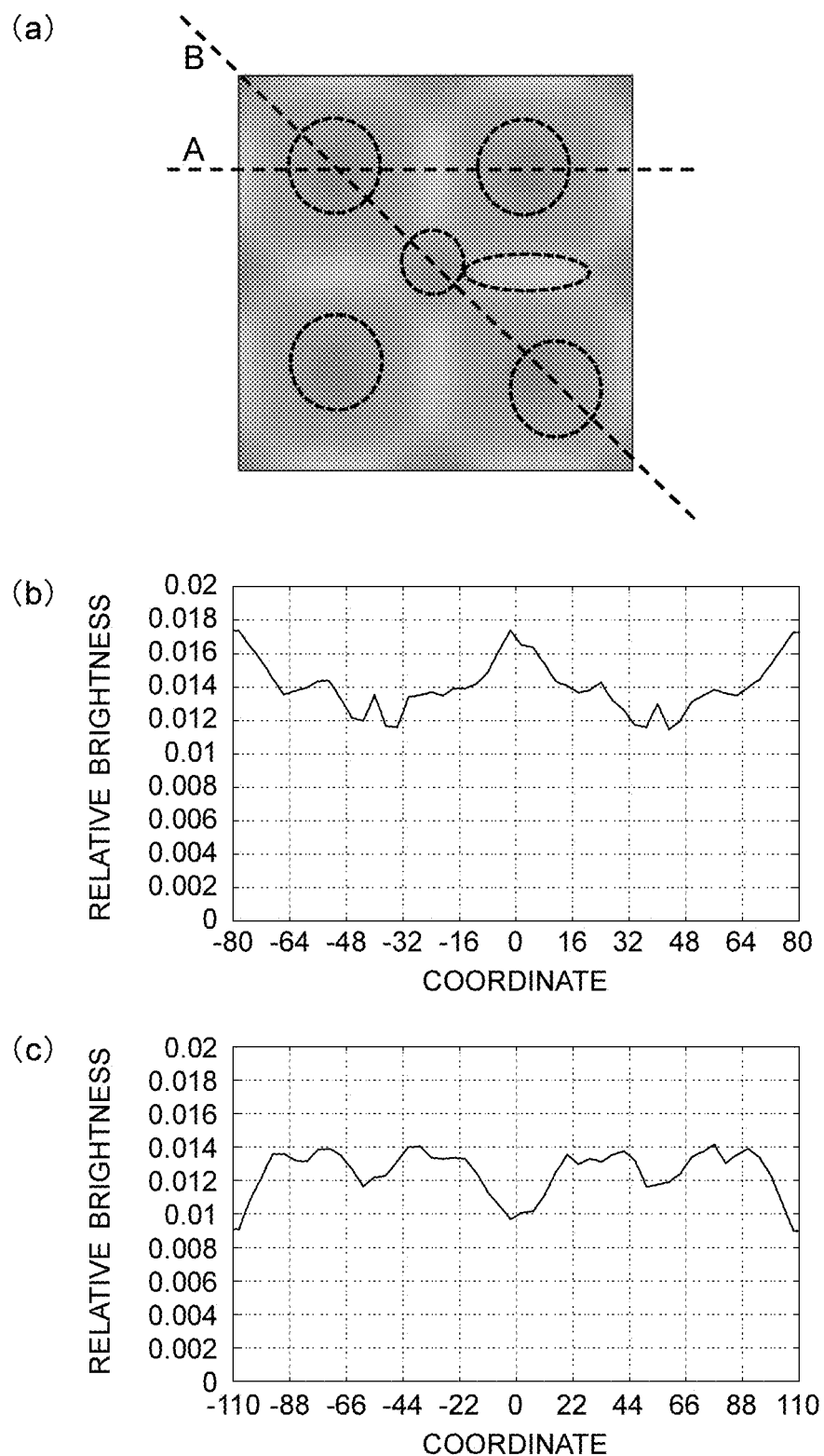

ILLUMINATION LENS AND ILLUMINATION MODULE

CROSS REFERENCE TO RELATED APPLICATIONS

This application is a continuation of International Patent Application No. PCT/JP2012/056374 filed Mar. 13, 2012, which claims priority from U.S. Provisional Patent Application No. 61/467,557 filed Mar. 25, 2011. The contents of these applications are hereby incorporated by reference.

TECHNICAL FIELD

The present invention relates to an illumination lens for an illumination module and an illumination module.

BACKGROUND ART

As an example of an illumination module, an illumination module for backlight using light emitting diodes (LEDs) is used as a large emitting-surface type illumination system such as a backlight unit for a TV set. Illumination modules for backlight using LEDs are divided into two types. One is an edge-light type in which lateral-emitting LEDs are arranged on the periphery of a backlight unit and lights from the LEDs are guided by a light-guiding plate to realize surface illuminant. The other is a direct type in which many LEDs which emit lights in the upward direction are arranged on a plane to realize surface illuminant. The edge-light type is advantageous to slimming down. On the other hand, the direct type is advantageous to improvement of image quality and energy-saving, because amount of lights to be emitted by each LED can be controlled depending on contrast of an image to be displayed.

FIG. 1 shows a plan view of an illumination module of direct type for backlight. The illumination module for backlight of illumination module includes an enclosure 209, a reflecting plate 203, boards 207 and illumination lenses 120. The reflecting plate 203 is provided at the bottom of the enclosure 209 and a number of elongated boards 207 are arranged in parallel to one another on the reflecting plate 203. On each of the boards 207, illumination lenses 120 including LEDs are arranged at regular intervals. As a result, illumination lenses 120 including LEDs are arranged at positions of lattice points of a rectangular lattice as shown in FIG. 1.

FIG. 2 shows a side view of the illumination module of direct type for backlight. Lights emitted from an LED 201 reach a diffusion plate 205 thorough the illumination lens 120. A portion of lights which have reached the diffusion plate 205 pass thorough and exit from the diffusion plate 205. The other portion of lights which have reached the diffusion plate 205 are reflected on the diffusion plate 205, reach the reflecting plate 203, are reflected on the reflecting plate 203, again reach the diffusion plate 205, pass thorough and exit from the diffusion plate 205. Thus, the illumination lenses 120, the reflecting plate 203, and the diffusion plate 205 are used such that brightness of lights emitted from the diffusion plate 205 is made even all over the diffusion plate 205.

FIG. 3 shows a side view of an illumination module of another direct type for backlight. Lights emitted from an LED 201 are reflected on a surface of an illumination lens, reach the reflecting plate 203, are reflected on the reflecting plate 203, reach the diffusion plate 205, pass thorough and exit from the diffusion plate 205. With such a construction, an illumination module of direct type for backlight, in which slimness and evenness of brightness are further enhanced, can be realized.

However, in conventional illumination modules of direct type for backlight, brightness of a diffusion plate has not been made even to a sufficient degree.

FIG. 4 illustrates unevenness of brightness of a diffusion plate of conventional illumination modules of direct type for backlight. In FIG. 4, illumination lenses 120 including LEDs 201 are arranged at positions of lattice points of a rectangular lattice. In FIG. 4, an area illuminated by a single illumination lens 120 including an LED 201 is marked with IL. The shape of the illumination lens 120 is symmetric about an axis, and therefore the illuminated area is circular. On the other hand, the illumination lenses 120 are arranged at positions of lattice points of the rectangular lattice as described above, and therefore a bright area R1 with a higher brightness and a dark area R2 with a lower brightness are generated on the diffusion plate.

In order to eliminate above-described unevenness of brightness, illumination lenses which are rectangularly shaped in outline have been developed (Patent Documents 1 and 2). However, in an illumination lens rectangularly shaped in outline, incident angles of rays which come from the light source and exit from the lens, are larger than those in a lens of axial symmetry. Accordingly, components of Fresnel reflection and total reflection increase, thus generating unevenness of illuminance on a plane to be illuminated. In order to prevent such unevenness of illuminance, the lens has to be upsized.

As another way to eliminate unevenness of brightness, a layout in which light sources are arranged in hexagonal lattice is proposed (Patent Documents 3 and 4). However, when this layout is employed, an area to be illuminated is also formed based on hexagonal lattice, and therefore there exists a mismatch between the area and an elongated rectangular range to be illuminated, which is generally required for backlight of TV sets or the like, along the outer edge. Accordingly, there arises a problem that illumination lights cannot effectively be used.

Thus, an illumination lens which makes brightness of an illumination module which is constructed by light sources arranged in rectangular lattice even and an illumination module of even brightness, which is constructed by light sources arranged in rectangular lattice have not been developed.

PATENT DOCUMENTS

Patent Document 1: JP4863357B (JP2007-227410A)
Patent Document 2: JP4842107B (JP2008-130422A)
Patent Document 3: JP2005-115372A
Patent Document 4: JP4332539B (JP2006-310319A)

Accordingly, there is a need for an illumination lens which makes brightness of an illumination module which is constructed by light sources arranged in rectangular lattice even and an illumination module of even brightness, which is constructed by light sources arranged in rectangular lattice.

SUMMARY OF INVENTION

An illumination lens according to a first aspect of the present invention is used for diffusing lights from an emitting element. The illumination lens includes a light receiving surface which is constructed to cover the emitting element located at the bottom; and a light exit surface of axial symmetry which is located outside the light receiving surface and makes lights of the emitting element which have entered the light receiving surface exit. When the axis of the light exit surface is designated as Z-axis, a position of the bottom of the illumination lens is designated as z=0 and X-axis and Y-axis are defined in a plane which contains z=0 and is perpendicular to Z-axis, the light receiving surface is symmetric about YZ-plane and XZ-plane and a cross-sectional area of a cross section of the light receiving surface which is parallel to XY-plane monotonously decreases with increase in z-coordinate. When the maximum value of z-coordinate on the light receiving surface is designated as d and a radius of the cross section of the light exit surface at z=0 is designated as r, a point (x, y) on a cross section of the light receiving surface at z=0.3d is represented by $$\sqrt{\left(\frac{x}{a}\right)^2 + \left(\frac{y}{b}\right)^2} = f(\theta) \quad (1)$$

$$0 \leq \theta \leq \frac{\pi}{2}$$

where a and b represent constants and $$\theta = \tan^{-1}\left(\frac{y}{x}\right)$$

$$f(0) = f\left(\frac{\pi}{2}\right) = 1.0,$$

and further, expressions $$f(\theta) \leq 1.0 \quad (2)$$

$$1 \leq \frac{x}{a} + \frac{y}{b} \quad (3)$$

are satisfied, and there exists a point at which expression $$f(\theta) \leq 0.95$$

is satisfied, and further, the following expressions are satisfied.

a<0.5 r and b<0.5 r

According to the present aspect, an illumination lens which makes brightness of an illumination module which is constructed by light sources arranged in rectangular lattice even, can be obtained.

An illumination lens according to a first embodiment of the first aspect further includes a reflecting surface and the illumination lens is constructed such that at least a portion of lights from the emitting element which have entered the light receiving surface are made to reach the light exit surface after having been reflected on the reflecting surface.

By the use of the illumination lens according to the present embodiment, an illumination module which is slimmer and has a more even distribution of brightness can be realized.

In an illumination lens according to a second embodiment of the first aspect, the light receiving surface has a top on Z-axis and "Sag" which is a distance in the Z-axis direction between the top of the light receiving surface and a point on the light receiving surface is expressed by $$Sag = \frac{c(x^2 + y^2)}{1 + \sqrt{1 - (1+k)c^2(x^2 + y^2)}} + \sum_{i,j} A_{ij} x^i y^j$$

where "i" and "j" represent positive integers while "c", "k" and "Ai,j" represent constants.

According to the present embodiment, the light receiving surface can be easily represented by terms of $x^i y^j$.

In an illumination lens according to a third embodiment of the first aspect, the light receiving surface is formed using a truncated pyramid edges of which have undergone chamfering or filleting.

According to the present embodiment, the light receiving surface can be easily designed by forming the light receiving surface using a truncated pyramid.

In an illumination lens according to a fourth embodiment of the first aspect, f(θ) is a continuous function which has a minimum value at θ=π/4.

An illumination module according to a second aspect of the present invention includes emitting elements arranged in rectangular lattice on a plane, illumination lenses according to the first aspect of the present invention, each of which covers each of the emitting elements and is arranged such that directions of X-axis and Y-axis agree with directions of two sides of the rectangle, and a diffusion plate formed to cover the illumination lenses.

The illumination module according to the present aspect uses the illumination lens according to the first aspect, and therefore brightness of the illumination module which is constructed by light sources arranged in rectangular lattice can be made even.

An illumination module according to a first embodiment of the second aspect of the present invention is the illumination module according to the second aspect, wherein when an interval between the emitting elements in the X-axis direction and an interval between the emitting elements in the Y-axis direction are designated as lx and ly, respectively, b/a is determined as a function of lx/ly.

According to the present embodiment, an illumination module in which brightness is made even depending on an interval lx between the emitting elements in the X-axis direction and an interval ly between the emitting elements in the Y-axis direction can be realized.

BRIEF DESCRIPTION OF DRAWINGS

FIG. 12 illustrates performance of an illumination lens 101X of Comparative Example 1.

DESCRIPTION OF EMBODIMENTS

Figure 5:
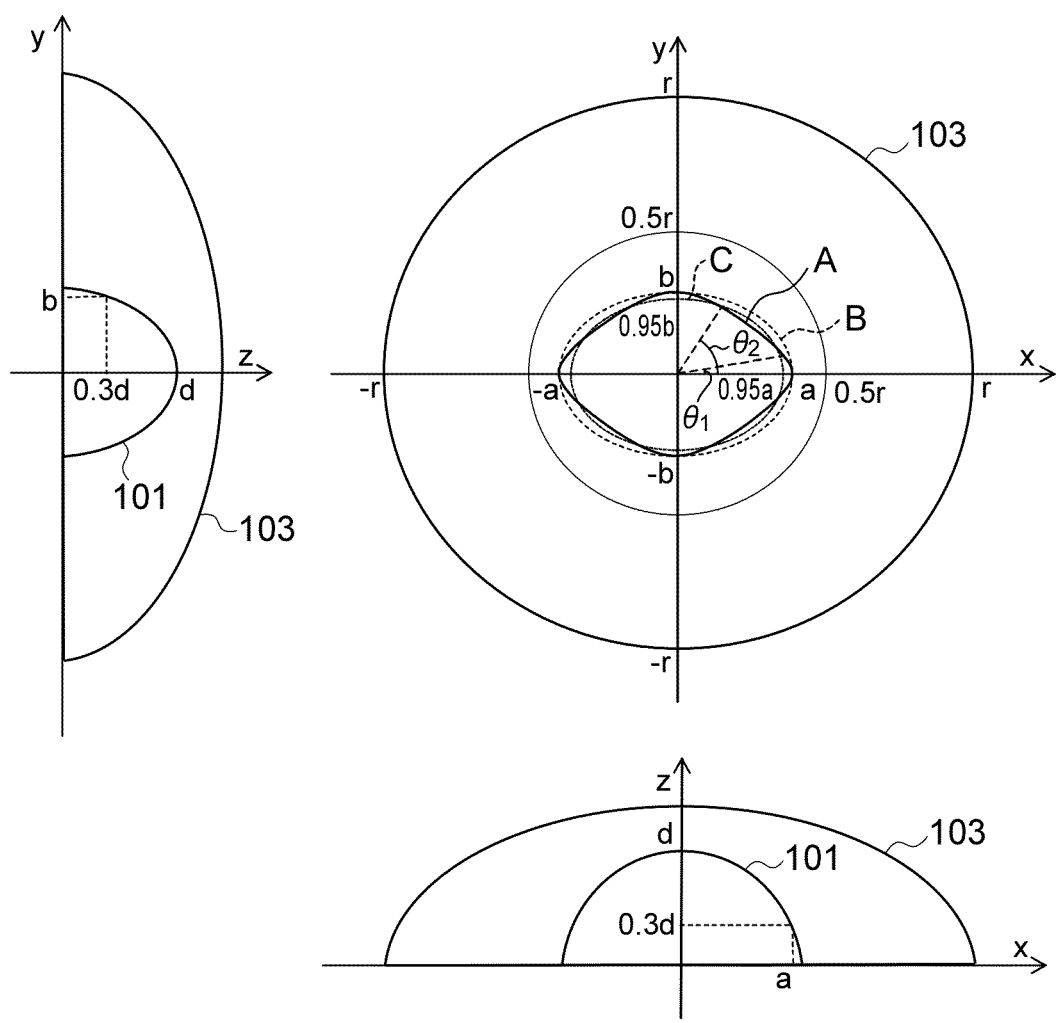
FIG. 5 illustrates a structure of an illumination lens according to an embodiment of the present invention.

FIG. 5 illustrates a structure of an illumination lens according to an embodiment of the present invention. The illumination lens is provided with a light receiving surface 101 which is constructed to cover an LED which is an emitting element located at the bottom, not shown, and a light exit surface 103 of axial symmetry which is located outside the light receiving surface 101 and makes lights of the LED which have entered the light receiving surface 101 exit. The illumination lens can be used also for light sources besides LEDs, such as laser diodes and organic light-emitting diodes.

The axis of the light exit surface 103 is designated as Z-axis and at a position of the bottom of the illumination lens the coordinate is designated as z=0. X-axis and Y-axis are defined in the plane which contains z=0 and is perpendicular to Z-axis. A radius of the cross section of the light exit surface 103 at z=0 is designated as r. The light receiving surface 101 is symmetric about YZ-plane and XZ-plane. Cross-sectional area of a cross section of the light receiving surface 101 which is parallel to XY-plane monotonously decreases with increase in z-coordinate. When the maximum value of z-coordinate on the light receiving surface 101 is designated as d, coordinates (x, y) of a point on a cross section of the light receiving surface 101 at z=(⅓)d are represented by $$\sqrt{\left(\frac{x}{a}\right)^2 + \left(\frac{y}{b}\right)^2} = f(\theta) \quad (1)$$

$$0 \le \theta \le \frac{\pi}{2}$$

where a and b represent constants and $$\theta = \tan^{-1}\left(\frac{y}{x}\right)$$

$$f(0) = f\left(\frac{\pi}{2}\right) = 1.0.$$

Further, expressions $$f(\theta) \le 1.0 \quad (2)$$

$$1 \le \frac{x}{a} + \frac{y}{b} \quad (3)$$

are satisfied, and there exists a point at which expression $$f(\theta) \le 0.95$$

is satisfied. Further, the following expressions are satisfied.

$$a < 0.5\ r \text{ and } b < 0.5\ r$$

When $f(\theta)$ is adjusted while expressions (2) and (3) are satisfied, a shape of the cross section changes between an ellipse and a rhombus. In FIG. 5, A represents the shape of the cross section. B and C represent an ellipse in the case of $f(\theta)=1$ and an ellipse in the case of $f(\theta)=0.95$, respectively. In FIG. 5, an angles which lines connecting points of intersection of A and C, and the origin form with X-axis are designated as $\theta_1$ and $\theta_2$, respectively. $\theta_1$ is approximately 10 degrees while $\theta_2$ is approximately 55 degrees. Accordingly, $f(\theta)$ of A is smaller than 0.95 in a continuous range of angle from approximately 10 degrees to approximately 55 degrees and is equal to or greater than 0.95 in the other range.

When dimensions of the light receiving surface 101 are not sufficiently small in comparison to outer dimensions of the lens, rays which have passed through the light receiving surface 101 have large angles of incidence with respect to the light exit surface 103. When rays have large angles of incidence with respect to the light exit surface 103, Fresnel reflection components increase. Further, in some cases there exist paths of rays along which rays enter the light exit surface 103 at angles which are greater than the critical angle. Reflecting lights thus generated cause unevenness of illuminance. Accordingly, cross-sectional dimensions of the light receiving surface 101 should be sufficiently small in comparison to outer dimensions of the lens. For this reason, the cross-sectional shape of the light receiving surface 101 at the position of z=(⅓)d is determined such that a<0.5 r and b<0.5 r are satisfied as described above.

Figure 6:
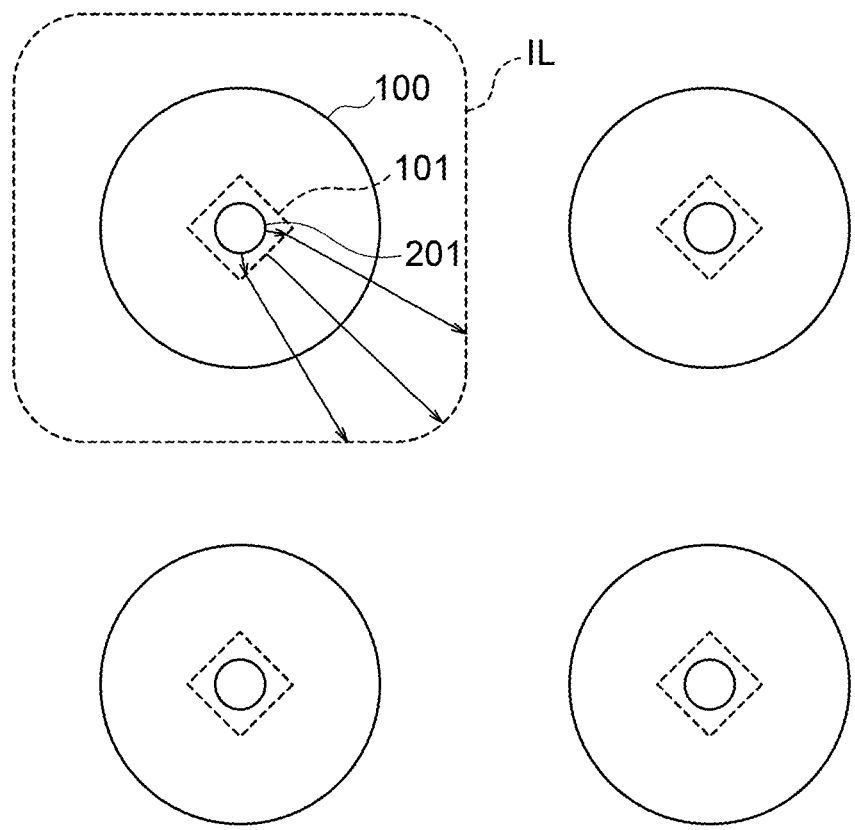
FIG. 6 illustrates function of the illumination lens according to the present embodiment.

FIG. 6 illustrates function of the illumination lens according to the present embodiment. The cross-sectional shape of the light receiving surface 101 at the position of z=(⅓)d of the illumination lens according to the present embodiment is close to a rhombus, and therefore rays emitted from the light source 201 in the x direction (in the horizontal direction in FIG. 6) and in the y direction (in the vertical direction in FIG. 6) are refracted when passing through the light receiving surface 101 and travel toward the opposite angles. Thus, rays emitted from each light source in the x direction or in the y direction are refracted when passing through the light receiving surface and travel toward the opposite angles. As a result, a shape of an illuminated area IL of each illumination lens becomes close to a rectangular shape which corresponds to the arrangement of the light sources, and therefore unevenness of illuminance across the whole area can be reduced and the illuminance distribution can be improved.

When the cross-sectional shape is changed from an ellipse such that it is made close to a rhombus by adjusting $f(\theta)$, an amount of rays which are deflected toward the opposite angles from the x direction and the y direction, increases. However, when the cross-sectional shape is made a complete rhombus, an amount of rays which travel in the x direction and the y direction may lack and dark portions may be generated at midpoints between light sources in the x direction and the y direction. For this reason, the cross-sectional shape is determined between an ellipse and a rhombus such that evenness of brightness is enhanced by adjusting $f(\theta)$ while Expressions (2) and (3) are satisfied.

Figure 1:
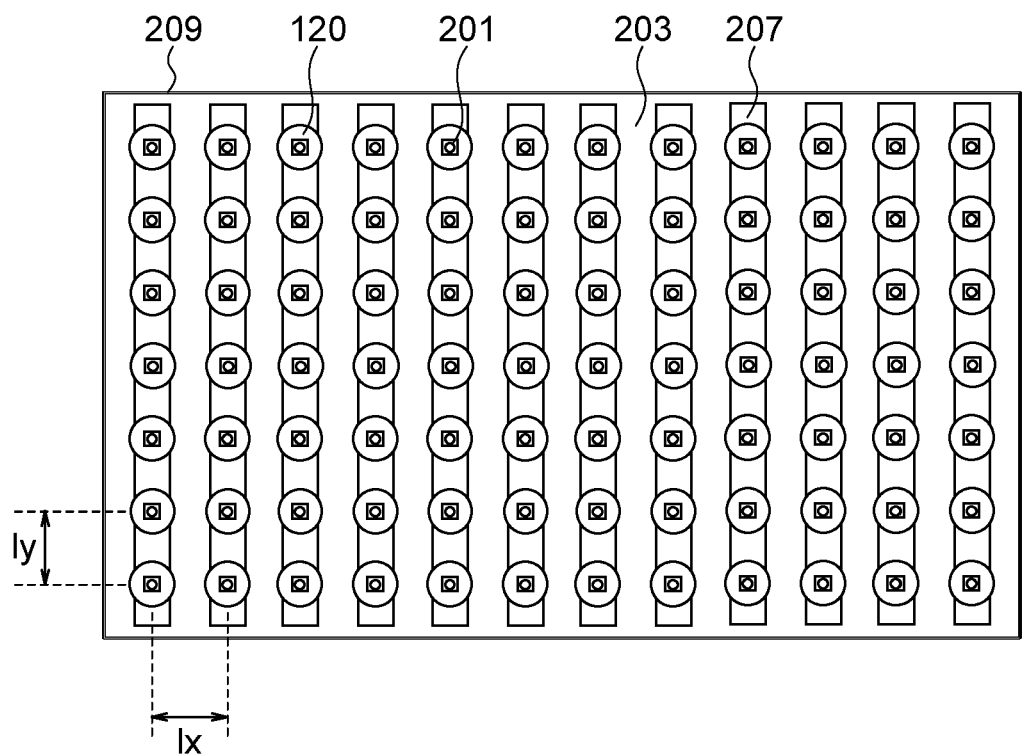
FIG. 1 shows a plan view of an illumination module of direct type for backlight.
Figure 2:
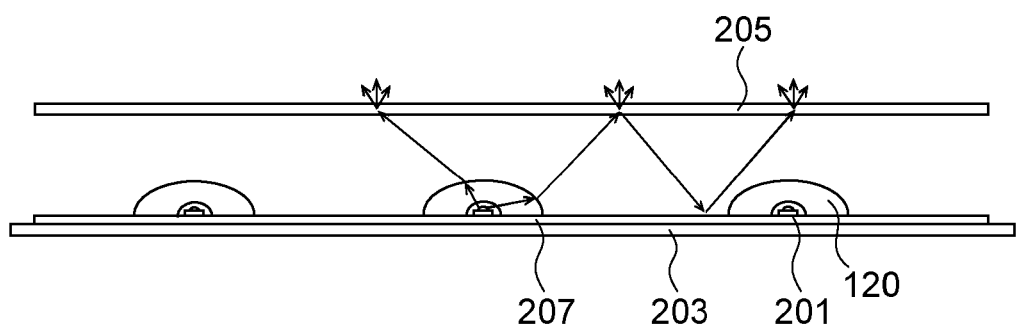
FIG. 2 shows a side view of the illumination module of direct type for backlight.
Figure 3:
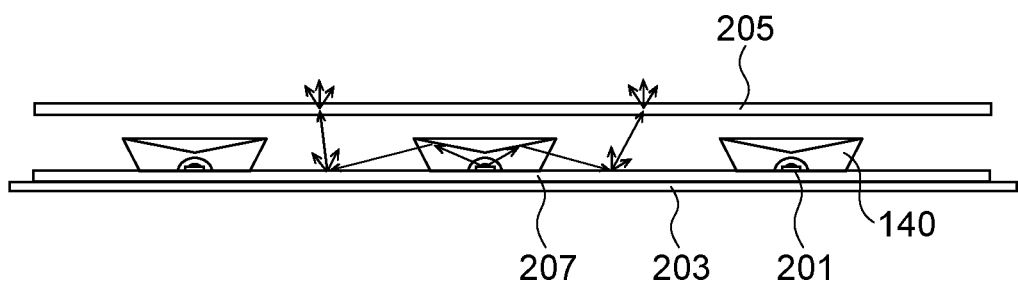
FIG. 3 shows a side view of an illumination module of another direct type for backlight.
Figure 4:
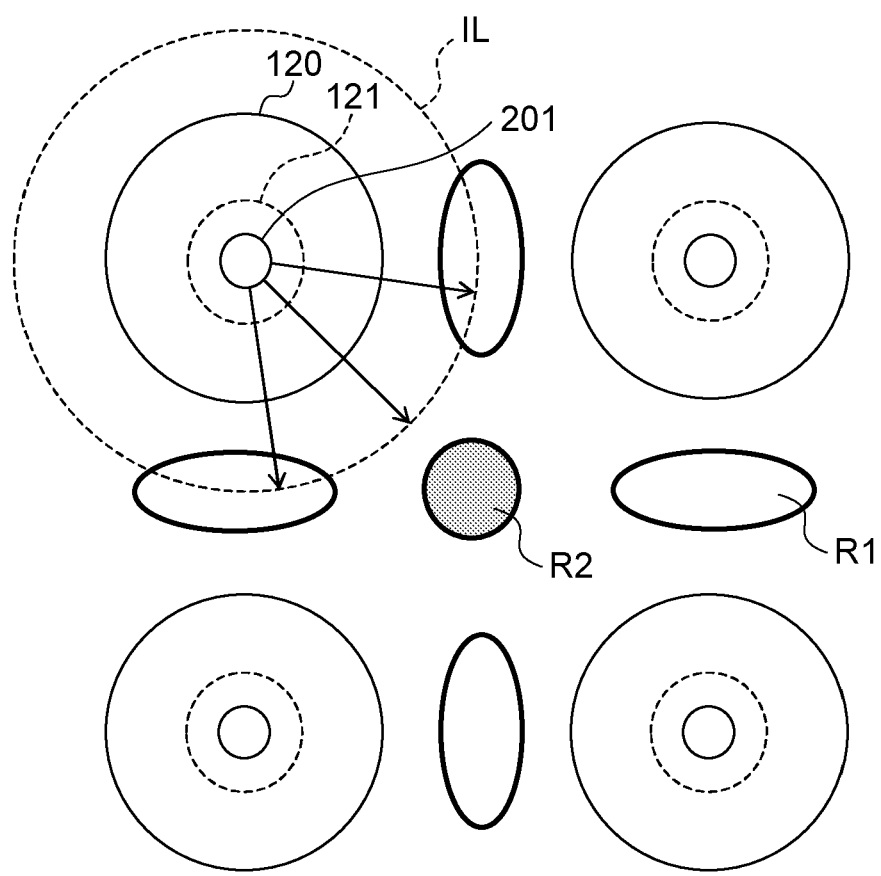
FIG. 4 illustrates unevenness of brightness of a diffusion plate of conventional illumination modules of direct type for backlight.

How to determine a ratio between a and b will be described below. As shown in FIG. 1, an interval in the x direction (in the horizontal direction in FIG. 1) and that in the y direction (in the vertical direction in FIG. 1) are designated as lx and ly, respectively. When a distance from the LED to the diffusion plate is designated as D, d/a and d/b are determined such that d/a and d/b correspond to lx/D and ly/D, respectively. In other words, the ratio between a and b is so determined as to correspond to ly/lx. More specifically, for example, assuming that k represents a value between 0.67 (=⅔) and 1.5 (=3/2) inclusive, the ratio between a and b is determined as below.

$$a/b = k(ly/lx)$$

Examples and a comparative example will be described below. In the examples and comparative example described below, a=b. Unit of length is millimeter unless otherwise described.

EXAMPLE 1

Figure 7:
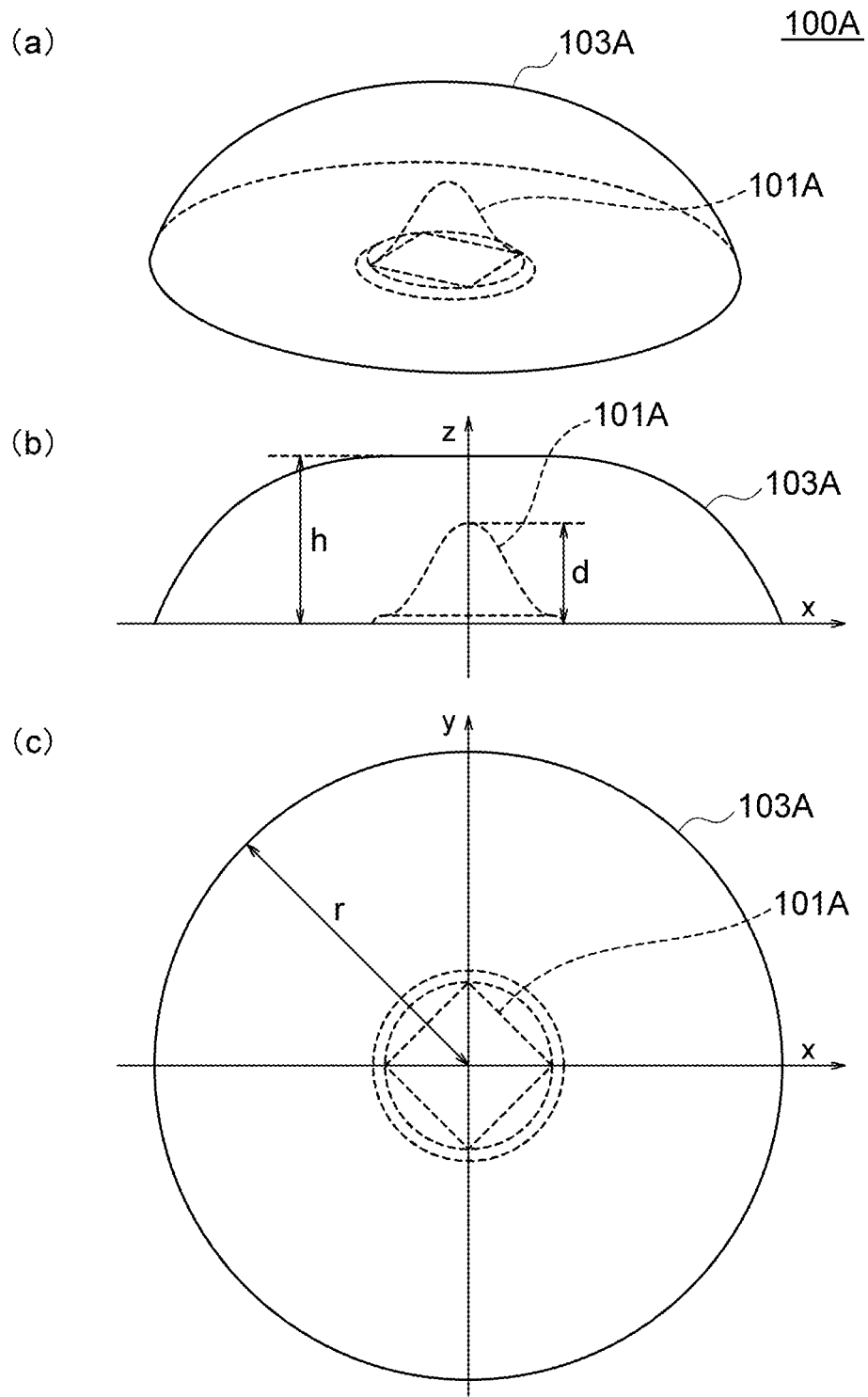
FIG. 7 shows a perspective view, a side view and a plan view of an illumination lens of Example 1.

FIG. 7 shows a perspective view, a side view and a plan view of an illumination lens of Example 1. The illumination lens 100A of Example 1 is provided with a light receiving surface 101A which is constructed to cover an LED which is an emitting element located at the bottom, not shown, and a light exit surface 103A of axial symmetry which is located outside the light receiving surface 101A and makes lights of the LED which have entered the light receiving surface 101A exit. The axis of the light exit surface 103A is designated as Z-axis and at a position of the bottom of the illumination lens the coordinate is designated as z=0. X-axis and Y-axis are defined in the plane which contains z=0 and is perpendicular to Z-axis. A height of the illumination lens 100A and a height (a depth) of the light receiving surface 101A are designated as h and d, respectively (FIG. 7(b)). The light receiving surface 101A has the highest point, that is, the top on Z-axis. A radius of the cross section of the light exit surface 103A at z=0 is designated as r (FIG. 7(c)).

Parameters which represent the illumination lens 100A of Example 1 are below.
Height h: 5.0
Depth d of the light receiving surface: 3.0
Radius r of the lens: 9.3
The light receiving surface 101A (xy polinominal)

$$Sag = \frac{c(x^2 + y^2)}{1 + \sqrt{1 - (1+k)c^2(x^2 + y^2)}} + \sum_{i,j} A_{ij} x^i y^j$$

"Sag" represents a distance in the Z-axis direction between the top of the light receiving surface and a point on the light receiving surface. "i" and "j" represent positive integers while "c", "k" and "Ai,j" represent constants.
c: 0.667
k: −5
$A_{20}$: −1.45
$A_{02}$: −1.45
$A_{40}$: 0.2
$A_{22}$: 0.1
$A_{04}$: 0.2
$A_{60}$: −0.01
$A_{06}$: −0.01
The light exit surface 103A (an aspheric surface of axial symmetry)

$$Sag = \frac{c\rho^2}{1 + \sqrt{1 - (1+k)c^2\rho^2}} + \sum_{i,j} \alpha_i \rho^i$$

$$\rho = \sqrt{(x^2 + y^2)}$$

Figure 8:
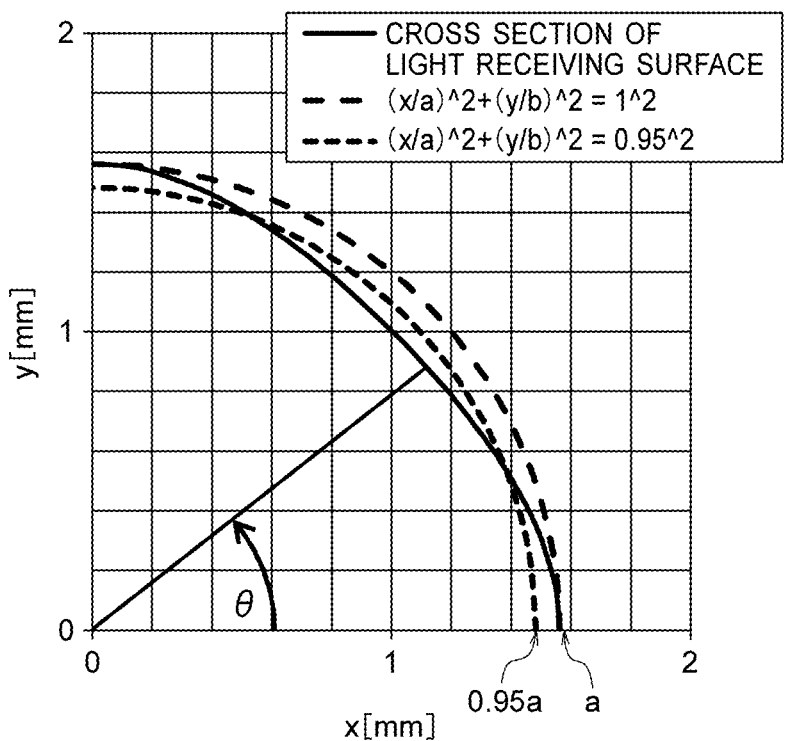
FIG. 8 illustrates a shape of the cross section at z=0.3 d of the light receiving surface of the illumination lens of Example 1.
Figure 8:
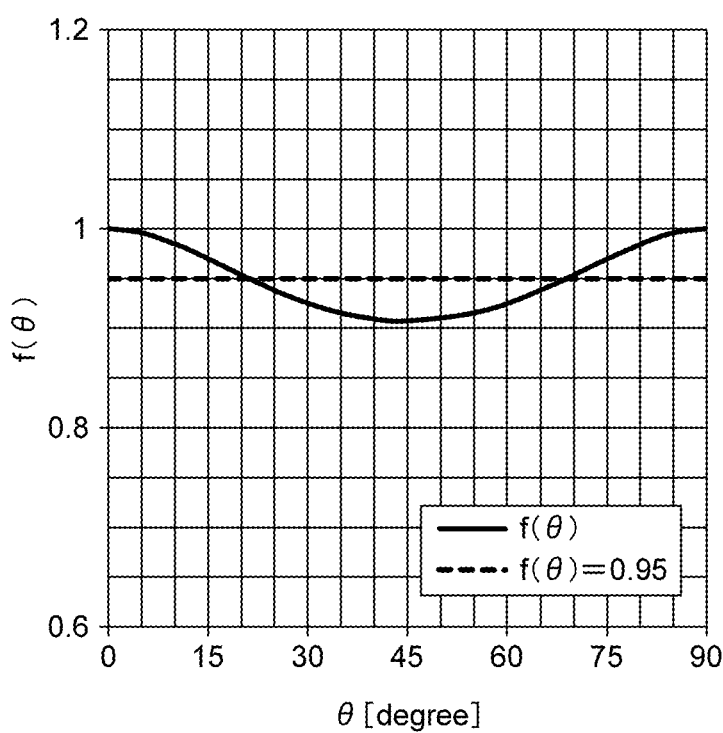

"Sag" represents a distance in the Z-axis direction between the top of the light exit surface and a point on the light exit surface. "i" and "j" represent positive integers while "c", "k" and "αd" represent constants.
c: 0
k: 0
$\alpha_2$: −6.0E−3
$\alpha_4$: −5.0E−4
$\alpha_6$: −1.0E−6
FIG. 8 illustrates a shape of the cross section at z=0.3 d of the light receiving surface 101A of the illumination lens 100A of Example 1.

FIG. 8(a) shows the shape of the cross section at z=0.3 d of the light receiving surface 101A of the illumination lens 100A of Example 1. A point (x, y) on the cross section of the light receiving surface 101A is represented by $$\sqrt{\left(\frac{x}{a}\right)^2 + \left(\frac{y}{b}\right)^2} = f(\theta) \quad (1)$$

$$0 \le \theta \le \frac{\pi}{2}$$

where $$\theta = \tan^{-1}\left(\frac{y}{x}\right)$$

$$f(0) = f\left(\frac{\pi}{2}\right) = 1.0.$$

Further, expressions $$f(\theta) \le 1.0 \quad (2)$$

$$1 \le \frac{x}{a} + \frac{y}{b} \quad (3)$$

are satisfied, and there exists a point at which expression $f(\theta) \le 0.95$ is satisfied. Further, the following expressions are satisfied.

a<0.5 r and b<0.5 r

FIG. 8(a) shows curves represented by the following expressions besides the shape of the cross section described above.

$$\sqrt{\left(\frac{x}{a}\right)^2 + \left(\frac{y}{b}\right)^2} = 1$$

$$\sqrt{\left(\frac{x}{a}\right)^2 + \left(\frac{y}{b}\right)^2} = 0.95$$

As apparently shown in FIG. 8(a), Expressions (2) and (3) described above are satisfied.

FIG. 8(b) represents a relationship between θ and f(θ). The horizontal axis represents θ while the vertical axis represents f(θ). In a continuous range of θ between 21 degrees and 69 degrees f(θ) is smaller than 0.95 while in the other ranges f(θ) is 0.95 or more.

X intercept a and y intercept b are as below.
a=1.56
b=1.56
Both are much smaller than 0.5 r=4.65, and the following expressions are satisfied.
a<0.5 r
b<0.5 r

EXAMPLE 2

Figure 9:
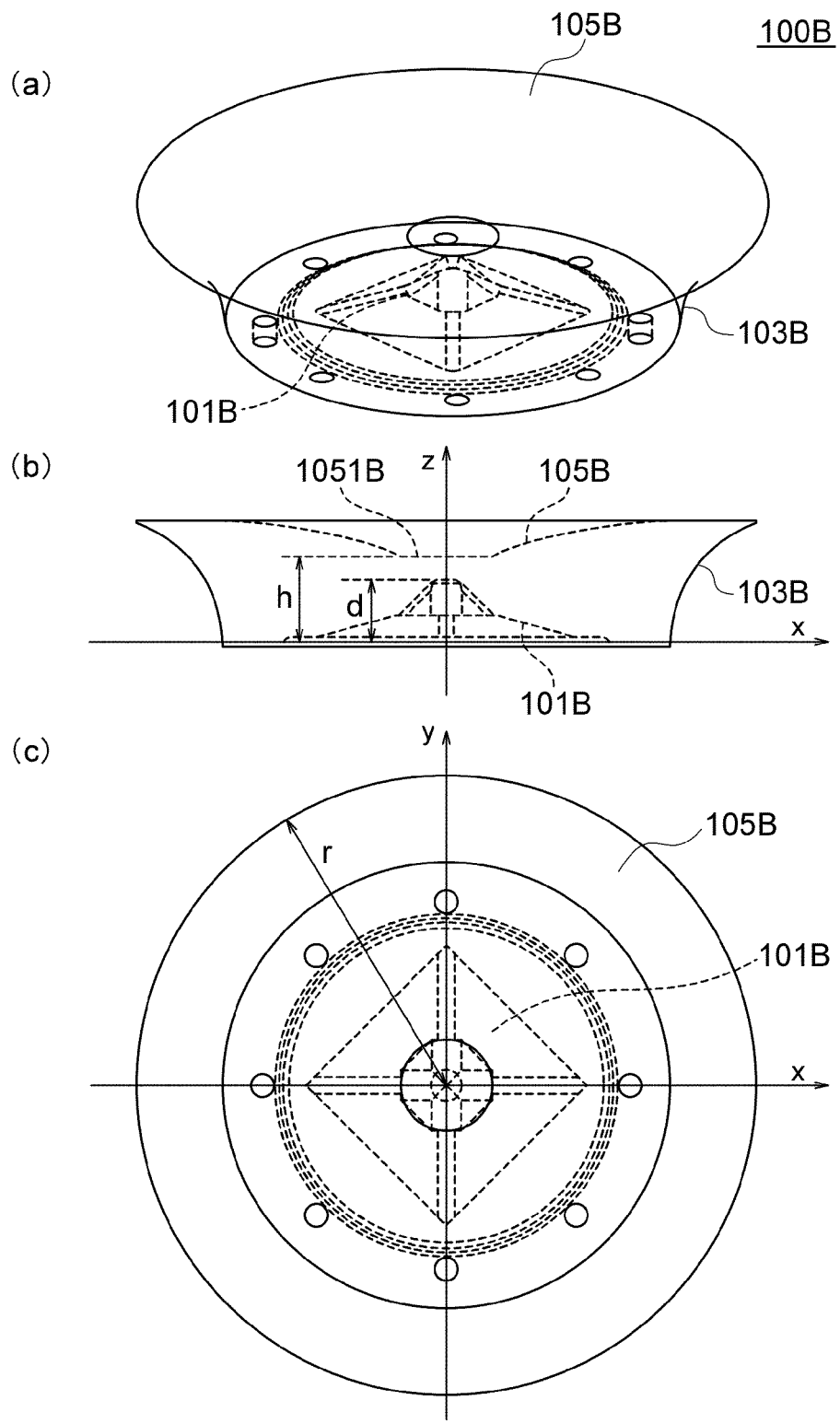
FIG. 9 shows a perspective view, a side view and a plan view of an illumination lens of Example 2.

FIG. 9 shows a perspective view, a side view and a plan view of an illumination lens of Example 2. The illumination lens 100B is provided with a light receiving surface 101B which is constructed to cover an LED which is an emitting element located at the bottom, not shown, a reflecting surface 105B which is arranged opposed to the light receiving surface 101B which reflects lights of the LED which enter the reflecting surface after having passed through the light receiving surface 101B, and a light exit surface 103B of axial symmetry which is located on the side and makes lights of the LED which have been reflected by the reflecting surface 105B exit. The axis of the light exit surface 103B is designated as Z-axis and at a position of the bottom of the illumination lens the coordinate is designated as z=0. X-axis and Y-axis are defined in the plane which contains z=0 and is perpendicular to Z-axis. A height of the illumination lens 100B at the center and a height (a depth) of the light receiving surface 101B are designated as h and d, respectively. A radius of the cross section which is parallel to XY-plane of the light exit surface 103B at the maximum height is designated as r (FIG. 9(c)).

The light receiving surface 101B is of a shape which is formed by arranging a truncated pyramid with sides which have a larger inclination with respect to the XY-plane on another truncated pyramid with sides which have a smaller inclination with respect to the XY-plane. Lights emitted by the LED are diffused by the light receiving surface 101B such that they move away from the optical axis (Z-axis) and deflect from the X-axis direction and the Y-axis direction toward the opposite angles. Lights which have passed through the light receiving surface 101B undergo total reflection on the reflecting surface 105B and laterally emitted through the light exit surface 103B.

Parameters which represent the illumination lens 100B of Example 2 are below.

Height h at the center: 3.06
Depth d of the light receiving surface: 2.26
Radius r of the lens: 11.0

The light receiving surface (truncated pyramids)

$0<z<0.975$

Dimensions of cross section (at z=0): A square of a side of 7.5 (a rhombus)
Dimensions of cross section (at z=0.975): A square of a side of 2.9 (a rhombus)

$0.975<z<2.26$

Dimensions of cross section (at z=0.975)): A square of a side of 2.9 (a rhombus)
Dimensions of cross section (at z=2.26): A square of a side of 1.0 (a rhombus)

The reflecting surface (an aspheric surface of axial symmetry)

$$Sag = \frac{c\rho^2}{1+\sqrt{1-(1+k)c^2\rho^2}} + \sum_{i,j} \alpha_i \rho^i$$

$$\rho = \sqrt{(x^2+y^2)}$$

"Sag" represents a distance in the Z-axis direction between the point at z=2.52 and a point on the light receiving surface. "i" represents a positive integer while "c", "k" and "αi" represent constants.

c: 0
k: 0
$\alpha_1$: 0.55
$\alpha_2$: −0.053
$\alpha_3$: 1.81E⁻3

The light exit surface (a torus surface)

Internal diameter: 4.9
Rotation diameter: 12.83

When edges of the truncated pyramids of the light receiving surface 101B are used without being processed, paths of rays are divided and unevenness of illuminance and uneven color are caused. Accordingly, the edges undergo chamfering or filleting before use.

The cross section at z=0.3d of the light receiving surface 101B of the illumination lens 100B of Example 2 is of a square (a rhombus) as shown in FIG. 9(c) and therefore Expressions (2) and (3) described above are satisfied.

In a continuous range of θ between 21.2 degrees and 78.8 degrees f(θ) of Expression (1) is smaller than 0.95 while in the other ranges it is 0.95 or more.

Values of a and b of Expression (1) are 1.56. Both are much smaller than 0.5 r=5.5, and the following expressions are satisfied.

a<0.5 r b<0.5 r

A portion 1051B of the reflecting surface 105B around Z axis is formed by a circular face which is perpendicular to Z axis. A diameter of the circle is 3.2. To the surface of the portion 1051B on the light source side reflective coating or mirror coating is applied in order to reduce an amount of lights which pass through the reflecting surface 105B and illuminate a portion immediately above the lens for, thus enhancing evenness of illuminance.

COMPARATIVE EXAMPLE 1

Figure 10:
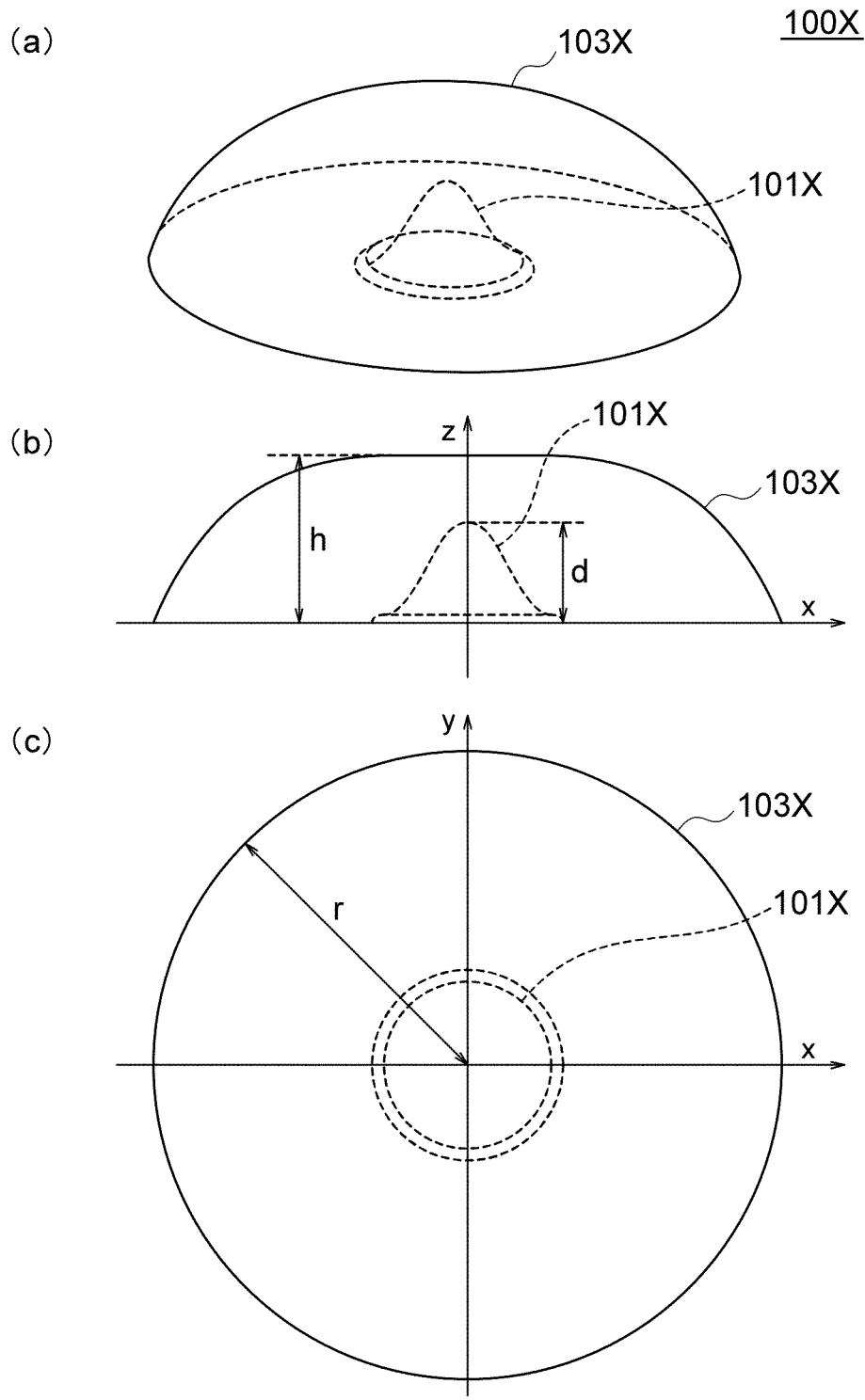
FIG. 10 shows a perspective view, a side view and a plan view of an illumination lens of Comparative Example 1.

FIG. 10 shows a perspective view, a side view and a plan view of an illumination lens of Comparative Example 1. The illumination lens 100X of Comparative Example 1 is provided with a light receiving surface 101X which is constructed to cover an LED which is an emitting element located at the bottom, not shown, and a light exit surface 103X of axial symmetry which is located outside the light receiving surface 101X and makes lights of the LED which have entered the light receiving surface 101X exit. The axis of the light exit surface 103X is designated as Z-axis and at a position of the bottom of the illumination lens the coordinate is designated as z=0. X-axis and Y-axis are defined in the plane which contains z=0 and is perpendicular to Z-axis. A height of the illumination lens 100X and a height (a depth) of the light receiving surface 101X are designated as h and d, respectively (FIG. 10(b)). A radius of the cross section of the light exit surface 103D at z=0 is designated as r (FIG. 10(c)).

The shape of the light exit surface 103X of the illumination lens 100X of Comparative Example 1 is identical with that of the light exit surface 103A of the illumination lens 100A of Example 1. The shape of the light receiving surface 101X in the cross section of x=0 and that in the cross section of y=0 are identical with the shape of the light exit surface 103A of the illumination lens 100A of Example 1 and are axially symmetric.

Parameters which represent the illumination lens 100X of Comparative Example 1 are below.

Height h: 5.0
Depth d of the light receiving surface: 3.0
Radius r of the lens: 9.3

The light receiving surface (an aspheric surface of axial symmetry)

$$Sag = \frac{c\rho^2}{1+\sqrt{1-(1+k)c^2\rho^2}} + \sum_{i,j} \alpha_i \rho^i$$

$$\rho = \sqrt{(x^2+y^2)}$$

"Sag" represents a distance in the Z-axis direction between the top of the light receiving surface and a point on the light receiving surface. "i" represents a positive integer while "c", "k" and "$\alpha_i$" represent constants.
c: 0.667
k: −5
$\alpha_2$: −1.45
$\alpha_4$: −0.2
$\alpha_6$: −0.01

The light exit surface (an aspheric surface of axial symmetry)

$$Sag = \frac{c\rho^2}{1+\sqrt{1-(1+k)c^2\rho^2}} + \sum_{i,j} \alpha_i \rho^i$$

$$\rho = \sqrt{(x^2+y^2)}$$

"Sag" represents a distance in the Z-axis direction between the top of the light exit surface and a point on the light exit surface. "i" represents a positive integer while "c", "k" and "Ai,j" represent constants.
c: 0
k: 0
$\alpha_2$: −6.0E−3
$\alpha_4$: −5.0E−4
$\alpha_6$: −1.0E−6

COMPARISON BETWEEN EXAMPLE 1 AND COMPARATIVE EXAMPLE 1

Comparison between performance of the illumination lens 101A of Example 1 and that of the illumination lens 101X of Comparative Example 1 will be made.

Figure 11:
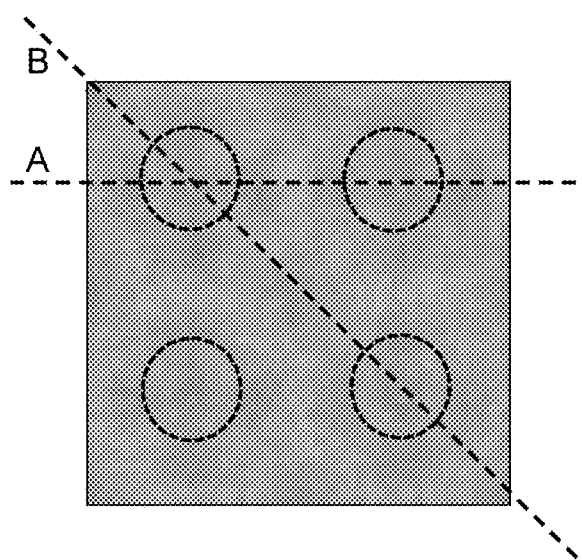
FIG. 11 illustrates performance of the illumination lens of Example 1.
Figure 11:
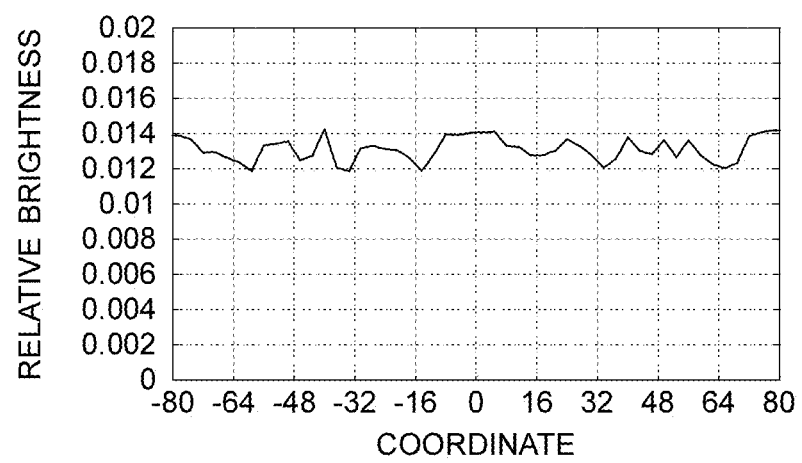
Figure 11:
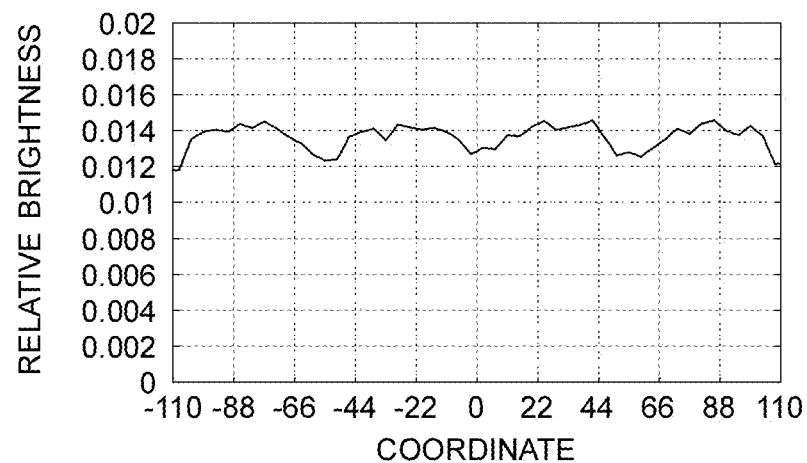

FIG. 11 illustrates performance of the illumination lens 101A of Example 1.

FIG. 11(a) is a plan view of an illumination module 100A in which four illumination lenses 101A are arranged. In FIG. 11(a), density represents brightness on a surface of the illumination module 100A. Lower density which is closer to white represents higher brightness.

FIG. 11(b) shows brightness in the cross section A shown in FIG. 11(a). Variation in brightness is within approximately 8%.

FIG. 11(c) shows brightness in the cross section B shown in FIG. 11(a). Variation in brightness is within approximately 8%.

FIG. 12 illustrates performance of an illumination lens 101X of Comparative Example 1.

FIG. 12(a) is a plan view of the illumination module 100X in which four illumination lenses 101X are arranged. In FIG. 12(a), density represents brightness on a surface of the illumination module 100A. Lower density which is closer to white represents higher brightness.

FIG. 12(b) shows brightness in the cross section A shown in FIG. 12(a). Variation in brightness is greater than 20%. In the cross section A, brightness is higher at midpoints between light sources.

FIG. 12(c) shows brightness in the cross section B shown in FIG. 12(a). Variation in brightness is greater than 15%. In the cross section B, brightness is lower at midpoints between light sources.

Comparison between FIG. 11 and FIG. 12 reveals that the illumination lens 101A of Example 1 reduces unevenness of brightness of an illumination module to a greater extent than the illumination lens 101x of Comparative Example 1.

What is claimed is:

1. An illumination lens for diffusing lights from an emitting element, comprising:

a light receiving surface which is constructed to cover the emitting element located at the bottom; and a light exit surface of axial symmetry which is located outside the light Receiving surface and transmits light that entered the lens from the light receiving surface to the outside of the lens, wherein when the axis of the light exit surface is designated as Z-axis, a position of the bottom of the illumination lens is designated as z=0 and X-axis and Y-axis are defined in a plane which contains z=0 and is perpendicular to Z-axis, the light receiving surface is symmetric about YZ-plane and XZ-plane and a cross-sectional area of a cross section of the light receiving surface which is parallel to XY-plane monotonously decreases with increase in z-coordinate, and wherein when the maximum value of z-coordinate on the light receiving surface is designated as d and a radius of the cross section of the light exit surface at z=0 is designated as r, a point (x, y) on a cross section of the light receiving surface at z=0.3$d$ is represented by $$\sqrt{\left(\frac{x}{a}\right)^2 + \left(\frac{y}{b}\right)^2} = f(\theta) \tag{1}$$

$$0 \le \theta \le \frac{\pi}{2}$$

where a and b represent constants and $$\theta = \tan^{-1}\left(\frac{y}{x}\right)$$

$$f(0) = f\left(\frac{\pi}{2}\right) = 1.0,$$

and further, expressions $$f(\theta) \le 1.0 \tag{2}$$

$$1 \le \frac{x}{a} + \frac{y}{b} \tag{3}$$

are satisfied, and there exists a point at which expression $$f(\theta) \le 0.95$$

is satisfied, and further, expressions a<0.5r and b<0.5r are satisfied, wherein the light receiving surface is of a shape which is formed by arranging a truncated pyramid with sides which have a larger inclination with respect to the XY-plane on another truncated pyramid with sides which have a smaller inclination with respect to the XY-plane.

2. An illumination lens according to claim 1, further comprising a reflecting surface wherein the illumination lens is constructed such that at least a portion of lights from the emitting element which have entered the light receiving surface are made to reach the light exit surface after having been reflected on the reflecting surface.

3. An illumination lens according to claim 1, wherein the light receiving surface has a top on Z-axis and "Sag" which is a distance in the Z-axis direction between the top of the light receiving surface and a point on the light receiving surface is expressed by $$Sag = \frac{c(x^2 + y^2)}{1 + \sqrt{1 - (1+k)c^2(x^2 + y^2)}} + \sum_{i,j} A_{ij} x^i y^j$$

where "i" and "j" represent positive integers while "c", "k" and "A$_{i,j}$" represent constants.

4. An illumination lens according to claim 1, wherein f($\theta$) is a continuous function which has a minimum value at $\theta=\pi/4$.

5. An illumination module comprising
emitting elements arranged in rectangular lattice on a plane;
illumination lenses, each of which includes
a light receiving surface which is constructed to cover one of the emitting elements located at the bottom; and
a light exit surface of which is located outside the light receiving surface and transmits light that entered the lends from the light receiving surface to the outside of the lens,
wherein when the axis of the light exit surface is designated as Z-axis, a position of the bottom of the illumination lens is designated as z=0 and X-axis and Y-axis are defined in a plane which contains z=0 and is perpendicular to Z-axis, the light receiving surface is symmetric about YZ-plane and XZ-plane and a cross-sectional area of a cross section of the light receiving surface which is parallel to XY-plane monotonously decreases with increase in Z-coordinate, and
wherein when the maximum value of z-coordinate on the light receiving surface is designated as d and a radius of the cross section of the light exit surface at z=0 is designated as r, a point (x, y) on a cross section of the light receiving at z=0.3d is represented by $$\sqrt{\left(\frac{x}{a}\right)^2 + \left(\frac{y}{b}\right)^2} = f(\theta) \quad (1)$$

$$0 \le \theta \le \frac{\pi}{2}$$

where a and b represent constants and $$\theta = \tan^{-1}\left(\frac{y}{x}\right)$$

$$f(0) = f\left(\frac{\pi}{2}\right) = 1.0,$$

and further, expressions $$f(\theta) \le 1.0 \quad (2)$$

$$1 \le \frac{x}{a} + \frac{y}{b} \quad (3)$$

are satisfied, and there exist a point at which expression $$f(\theta) \le 0.95$$

is satisfied, and further, expressions a<0.5r and b<0.5r are satisfied, and
a diffusion plate formed to cover the illumination lenses,
wherein each of the illumination lenses is arranged such that directions of X-axis and Y-axis agree with directions of two sides of rectangle of the rectangular lattice and when an interval in the X-axis direction and an interval in the Y-axis direction are designated as lx and ly, respectively, assuming the k represents a value between ⅔ and ½ inclusive, the relationship a/b=k(ly/lx)

holds
wherein the light receiving surface is of a shape which is formed by arranging a truncated pyramid with sides which have a larger inclination with respect to the XY-plane on another truncated pyramid with sides which have a smaller inclination with respect to the XY-plane.

* * * * *